United States Patent
Katayama et al.

(10) Patent No.: US 6,851,417 B2
(45) Date of Patent: Feb. 8, 2005

(54) IGNITION DEVICE FOR INTERNAL COMBUSTION ENGINE

(75) Inventors: Masahiro Katayama, Osaka (JP); Tsuyoshi Yamaguchi, Osaka (JP); Kazuhiko Okamura, Osaka (JP); Kouji Hiragi, Osaka (JP); Kounosuke Inamura, Osaka (JP)

(73) Assignee: Diamond Electric Mfg. Co., Ltd., Osaka (JP)

( * ) Notice: Subject to any disclaimer, the term of this patent is extended or adjusted under 35 U.S.C. 154(b) by 13 days.

(21) Appl. No.: 10/359,103

(22) Filed: Feb. 6, 2003

(65) Prior Publication Data
US 2003/0192519 A1 Oct. 16, 2003

(30) Foreign Application Priority Data

Apr. 12, 2002 (JP) .................................. P 2002-111001

(51) Int. Cl.⁷ ................................................ F02P 11/00
(52) U.S. Cl. ...................................................... 123/634
(58) Field of Search ................................ 123/634, 447, 123/635, 647; 336/96

(56) References Cited

U.S. PATENT DOCUMENTS

| | | | | |
|---|---|---|---|---|
| 5,296,999 A | * | 3/1994 | Taruya | 361/247 |
| 5,315,982 A | * | 5/1994 | Ward et al. | 123/634 |
| 5,438,971 A | * | 8/1995 | Murata et al. | 123/634 |
| 5,558,074 A | * | 9/1996 | Fukatsu et al. | 123/647 |
| 5,758,624 A | | 6/1998 | Satou et al. | |
| 6,257,215 B1 | * | 7/2001 | Kaminaga et al. | 123/647 |
| 6,378,514 B1 | * | 4/2002 | Kaminaga et al. | 123/633 |
| 6,484,708 B2 | * | 11/2002 | Hirakawa et al. | 123/647 |

FOREIGN PATENT DOCUMENTS

| | | |
|---|---|---|
| EP | 0 984 463 A1 | 3/2000 |
| FR | 2 817 919 A1 | 6/2002 |
| WO | WO 01/06117 A1 | 1/2001 |

OTHER PUBLICATIONS

European Search Report dated May 7, 2004.

* cited by examiner

Primary Examiner—Mahmoud Gimie
(74) Attorney, Agent, or Firm—McGinn & Gibb, PLLC

(57) ABSTRACT

An external connection terminal connector as a separate part that mounts the igniter is abolished, and the external connection terminal is integrated with the igniter itself. The igniter has the electronic components mounted on an internal wiring substrate, and the electronic components within the igniter and the external connection terminal are directly connected by wire bonding.

15 Claims, 5 Drawing Sheets

IGNITION DEVICE FOR INTERNAL COMBUSTION ENGINE

BACKGROUND OF THE INVENTION

The present invention relates to an igniter for controlling a primary current to be turned on or off, which is used with an ignition device for internal combustion engine, and more particularly to an ignition device for internal combustion engine in which an igniter and an ignition coil are integrated within an ignition device case.

Conventionally, there is proposed an ignition device for internal combustion engine in which an igniter and an ignition coil are equipped within the same ignition device case. Particularly in recent years, the ignition device arranged for each ignition plug is spread. FIG. 5 shows the structure of an igniter for use with this ignition device, and FIG. 6 show a method of mounting the igniter on the ignition coil of the ignition device for internal combustion engine. As previously described, the ignition coil and the igniter are indispensable for each other and employed as a set in the ignition device for internal combustion engine.

In FIGS. 5 and 6, the ignition device has a primary coil and a secondary coil buried in a plug hole provided in an engine main body, not shown, in which an igniter 10 is disposed directly above the coil portion and outside the plug hole, these being accommodated within an ignition device case. As shown in FIG. 5, the igniter 10 is connected to a connector 1 having an external connection terminal 2 for supplying the power from a battery or the like, and an igniter metal terminal 9 connected to the external connection terminal 2. A cover 11 made of an elastic material such as resin is put on the igniter 10, and a filling epoxy resin is filled in the entity of the igniter 10 and cured to have the finished product.

As above described, when the igniter 10 is mounted on the ignition coil 13 as shown in FIG. 6, there is a need for preparing the connector 1 separately as the external connection terminal of the igniter 10, as shown in FIG. 5.

When the igniter 10 is mounted on the ignition coil 13, first of all, the igniter 10 is fitted into the connector 1. Then, the igniter metal terminal 9 provided on the side face of the igniter 10 and the external connection terminal 2 provided in the connector 1 are joined by welding or the like.

In this manner, an igniter connector ASSY 12 having the connector 1 fitted is attached to the ignition coil 13. Thereafter, the upper part of the ignition coil 13 having the igniter 10 mounted is filled and sealed with the filling epoxy resin 14, whereby the igniter 10 is fixed.

Generally, in the prior art, the igniter 10 of FIG. 5 has the components packaged internally on one face or both faces of a single plane or a single layer of the substrate, whereby the igniter 10 has a large current portion and a small current portion of the circuit placed proximately on the internal wiring substrate.

However, the igniter 10 has the following problems. A first problem is that the connection with the external connection terminal 2 must be made using the connector 1 that is prepared as a separate part, and before the igniter 10 itself is placed in the ignition coil 13, the electrical or mechanical connection between the igniter 10 and the connector 1 by welding or the like is required, increasing in the number of parts, degrading the operability of welding, or increasing the number of steps needed for welding. More specifically, with the above constitution, a number of bonding points are required corresponding to the number of external terminals, and if the number of bonding or welding points is increased, there occurs a problem with non-contactness at the connection, with the reliability lower in proportion to an increase in the number of contact portions.

A second problem is that a mounting portion of the igniter 10 in the ignition coil 13 is filled and sealed with the filling epoxy resin 14 to fix the igniter 10 joined with the connector 1, but the igniter 10 itself is of the structure that is only molded with the molding resin 7, whereby the cover 11 is needed as a separate part to relieve a stress due to thermal expansion or contraction of the filling epoxy resin 14. In this respect, there is the problem with the increased number of parts, poor operability, the increased number of steps, and the lower reliability.

Further, a third problem is that when all the components are arranged on a single plane of the internal wiring substrate or lead frame to give the added value to the igniter, it is necessary to take a large space for the internal wiring substrate, and the igniter 10 is limited in saving the space. Further, when the internal wiring substrate is employed for packaging the components, the components are arranged on the single or double faces of the internal wiring substrate, whereby the large current portion and the small current portion are placed proximately in the circuit of the internal wiring substrate, causing a current produced during the operation of the igniter 10 to affect adjacent conductive patterns, and causing the noise of the igniter 10 due to an interference of electromagnetic induction, resulting in an adverse influence on the primary current shut-off control. Moreover, there remains the unsolved problem that when the igniter 10 is driven, heat produced from the internal packaged components will easily affect the components on the single plane.

SUMMARY OF THE INVENTION

This invention is achieved in the light of the above-mentioned problems, and it is an object of the invention to provide an igniter in which the number of parts is reduced, the number of assembling steps is reduced, and the thermal stress is lowered.

To achieve the above object, the present invention provides the following constitution. The external connection terminal connector as a separate part that mounts the igniter is abolished, and the external connection terminal is integrated with the igniter itself. The igniter has the electronic components mounted on the internal wiring substrate made of ceramic, and is accommodated, together with the IGBT and the heat sink for heat radiation, within the plastic case. The conduction between the electronic components within the igniter and the external connection terminal can be directly made by wire bonding with the external connection terminal. Further, the outer package of the igniter is the plastic case, or the rubber based cushioning material is coated on the surface of the igniter. Further, the internal parts of the igniter are wired and arranged three dimensionally, and the igniter is divided into the large current circuit portion and the small current circuit portion. The three dimensional wiring and arrangement of the circuit may be the lead frame.

More specifically, according to a first aspect of the present invention, there is provided an ignition device for internal combustion engine comprising an igniter case having a primary input terminal, in which an igniter is disposed, and an ignition coil under the igniter case, characterized in that the igniter arranged in the igniter case and the primary input terminal are connected by wire bonding and thereby integrally molded. Further, the ignition device for internal combustion engine is characterized in that a molding resin is filled in the igniter case, and the igniter case is made of plastic capable of absorbing an expansion or contraction stress of the molding resin. Further, the ignition device for internal combustion engine is characterized in that a molding resin is filled in the igniter case, and a rubber based cushioning material is coated on the surface of the molding resin. Further, the ignition device for internal combustion engine is characterized in that a molding resin is filled in the igniter case, and after the igniter case is disposed at a predetermined position, a filling epoxy resin is poured into an ignition device case and cured, wherein a rubber based cushioning material is mixed into at least one of the molding resin or the filling epoxy resin.

According to another aspect of the invention, there is provided an ignition device for internal combustion engine comprising an igniter case having a primary input terminal, in which an igniter is disposed, and an ignition coil under the igniter case, characterized in that the igniter is disposed in the igniter case and consists of a driving element on a mounting substrate or a lead frame, in which the mounting substrate or lead frame and the primary input terminal are connected by three dimensional wiring. Further, the ignition device for internal combustion engine is characterized in that an internal wiring substrate forming the igniter is divided into a large current substrate and a small current substrate.

With the above constitution, when the igniter is placed in the ignition device, the connector as the separate part and the step of welding the igniter with the connector can be omitted. The stress due to thermal expansion or contraction of the filling epoxy resin to fix the igniter within the ignition device can be relieved only by the plastic case that is the outer package of the igniter, without the use of the cover as the separate part.

Further, the stress due to thermal expansion or contraction of the filling epoxy resin to fix the igniter within the ignition device can be relieved only by the plastic case that is the outer package of the igniter, without the use of the cover as the separate part.

The mounting area is defined in three dimensions by the three dimensional wiring and arrangement of internal mounting substrate or the lead frame to make the effective use of the mounting space, whereby the igniter is saved in space. Further, each internal wiring substrate is divided into the large current circuit and the small current circuit, thereby making it possible to suppress an interference due to electromagnetic induction when the igniter is in operation, and design the igniter with the heat resistance.

DETAILED DESCRIPTION OF THE PREFERRED EMBODIMENTS

Figure 1:
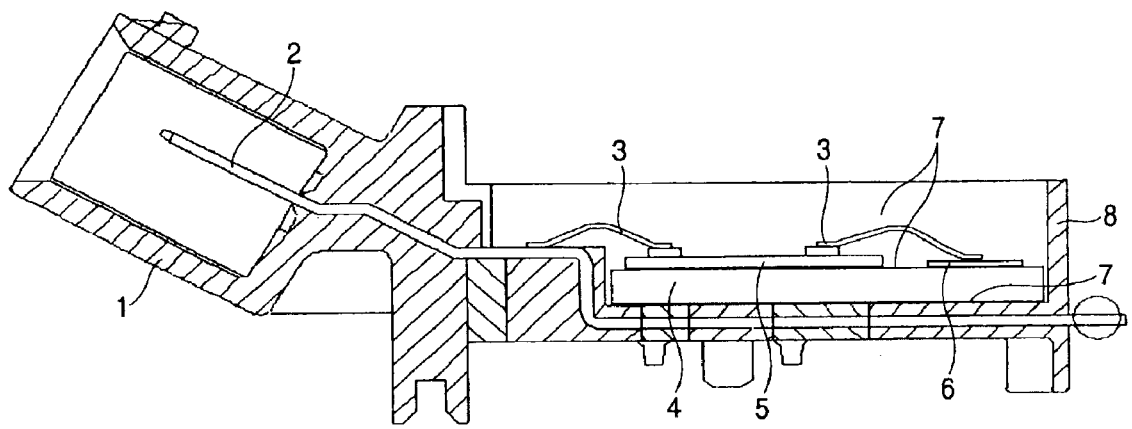
FIG. 1 is a cross-sectional view of the structure of an igniter according to a first embodiment of the present invention.

Referring to FIG. 1, a first embodiment of the present invention will be described below. In this invention, an igniter is not a package product such as a general-purpose power transistor or IGBT, but a component before molding in which a driving element 6 is arranged on an internal wiring substrate. Further, an ignition device of this invention is composed of the igniter and an ignition coil 13, both of which are accommodated within the same ignition device case, in which the igniter is contained in an igniter case and filled with a molding resin.

In FIG. 1 representing the first embodiment of the invention, the igniter comprises an internal wiring substrate 5 made of ceramics and formed of alumina, which has a driving control IC. The internal wiring substrate 5 has a circuit pattern printed and the electronic components mounted to provide the additional functions, and bonded on a heat sink for heat radiation 4 by adhesives. On the surface of the heat sink 4, the driving element 6 consisting of a Darlington transistor for making switching drive to turn on or off the primary current is disposed. The driving element 6 may consist of IGBT. The internal wiring substrate 5 and these components making up the igniter, such as the driving element 6 and the heat sink for heat radiation 4 are accommodated within the igniter case 8 formed of plastic such as PPO, PPT, PBT and PET. The igniter case 8 has the connector 1 for connecting to the external connection terminal 2, the igniter and the external connection terminal 2 being integrally molded. The igniter components accommodated within the igniter case 8 and the external connection terminal 2 are electrically connected by a bonding wire 3, and the igniter is molded by a molding resin 7 with the igniter case 8 as the outer packaging after wire bonding.

Figure 2:
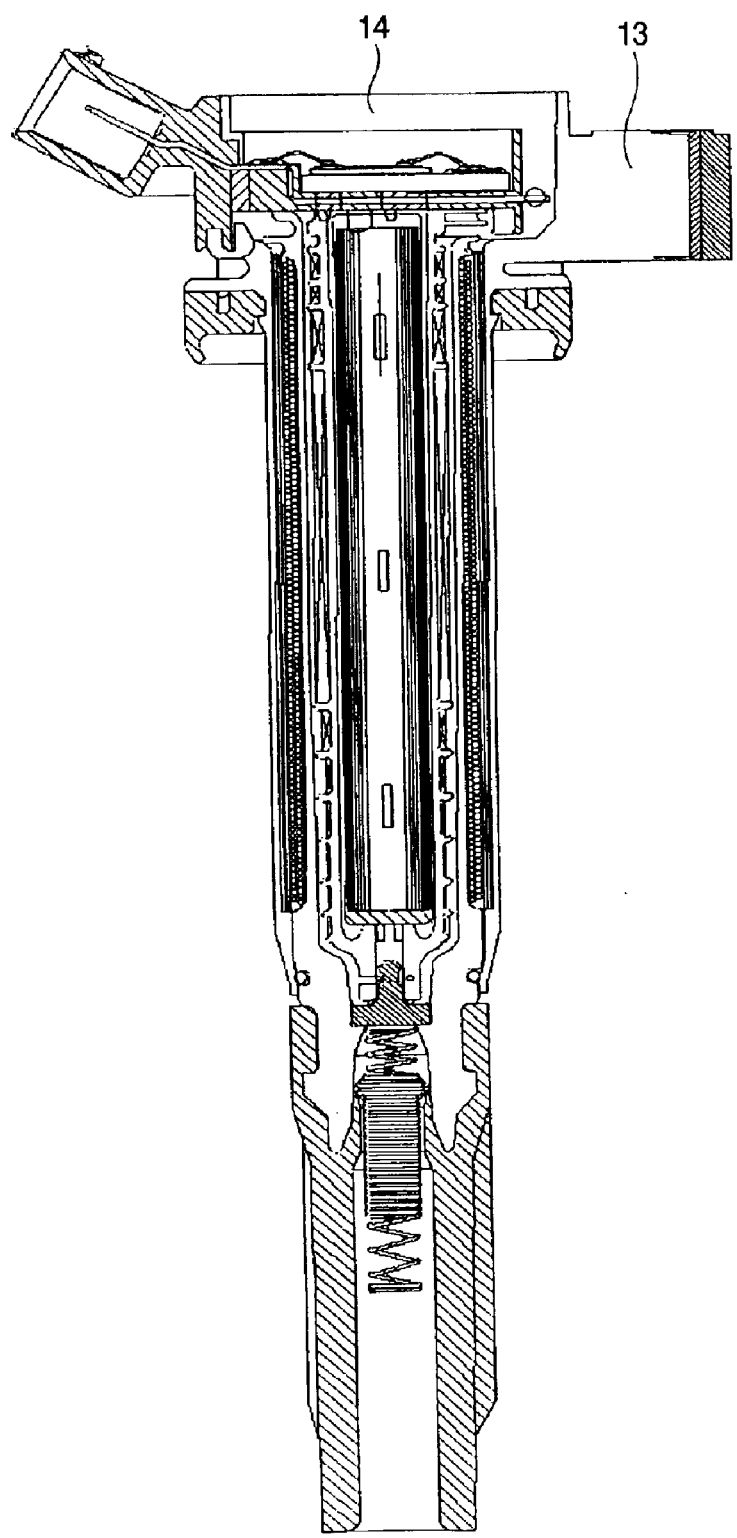
FIG. 2 is a cross-sectional view of the igniter of FIG. 1 mounted on an ignition device.

The igniter that is molded with the igniter case 8 as the outer packaging is placed in an igniter mounting space within the ignition device case, as shown in FIG. 2. Since the external connection terminal 2 is already formed integrally with the igniter case 8, there is no need for the connector 1 as a separate part and the step of welding the igniter and the connector, resulting in the smaller number of parts and the reduced number of steps.

The igniter is electrically connected with the ignition coil 13, then filled with the filling epoxy resin 14 and fixed, as shown in FIG. 2. The thermal expansion or contraction coefficient of the filling epoxy resin 14 is higher than that of other parts, but because the stress developed due to the thermal expansion or contraction of the filling epoxy resin 14 is relieved by the igniter case 8, the stress applied on the igniter itself is reduced without the use of the cover 11 for igniter that is conventionally employed as the separate part.

Figure 3:
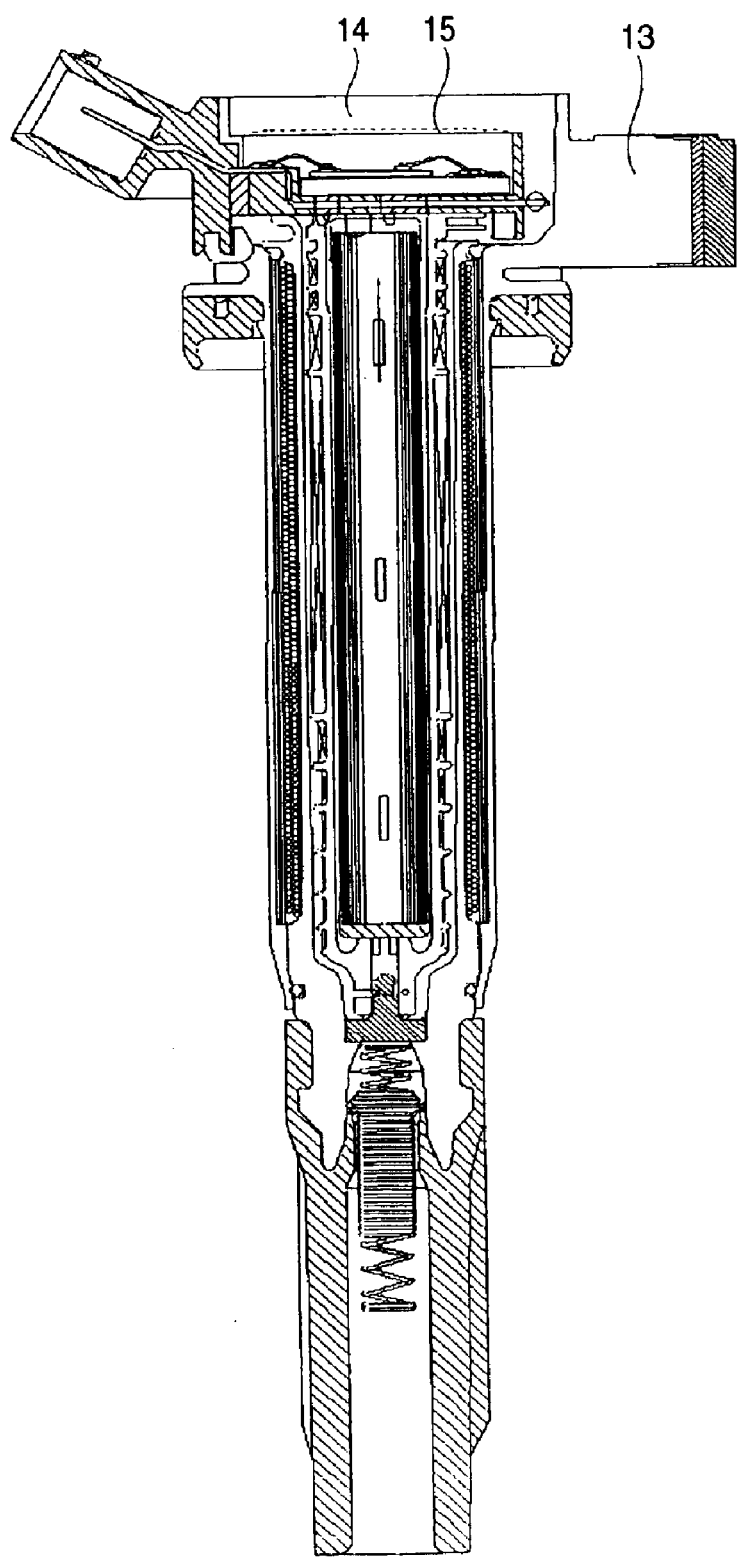
FIG. 3 is a cross-sectional view of the structure of an igniter according to a second embodiment of the invention.

Referring to FIG. 3, A second embodiment of this invention will be described below. In FIG. 3, the structure of a main portion is the same as described in the first embodiment, and the different points from the first embodiment will be only described. In the second embodiment, after the wire bonding is made by the bonding wire 3, the inside of the igniter case 8 is molded by the molding resin 7, and a rubber based cushioning material is coated on a surface layer of the igniter.

The igniter is electrically connected with the ignition coil 13, then filled with the filling epoxy resin 14 and fixed, as shown in FIG. 2. The thermal expansion or contraction coefficient of the filling epoxy resin 14 is higher than that of other parts, but because the stress developed due to the thermal expansion or contraction of the filling epoxy resin 14 is relieved by the rubber based cushioning material 15 coated on the surface layer of the igniter, igniter case 8, the stress applied on the igniter itself is reduced without the use of special cover for covering the entire igniter. As another example, the rubber based cushioning material 15 is not coated on the surface of the filling epoxy resin 14 but may be mixed on at least one of the filling epoxy resin 14 or the molding resin 7 to obtain the cushioning action, whereby the rubber based cushioning material 15 may be mixed into at least one of those resins.

Figure 4:
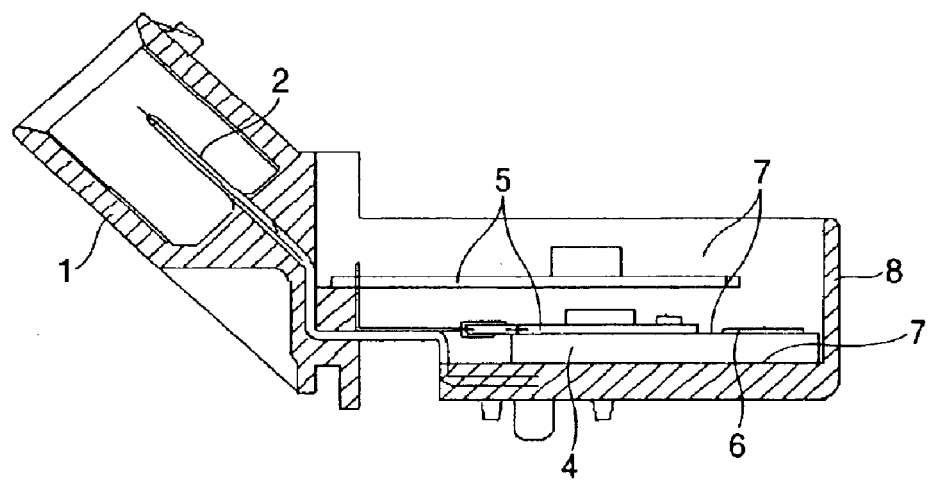
FIG. 4 is a cross-sectional view of the structure of an igniter according to a third embodiment of the invention.
Figure 5:
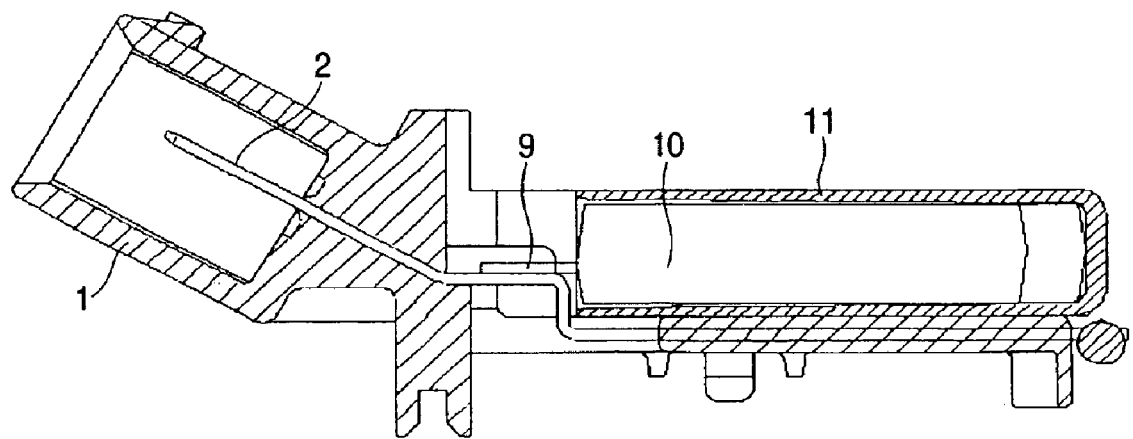
FIG. 5 is a cross-sectional view of the conventional igniter.
Figure 6:
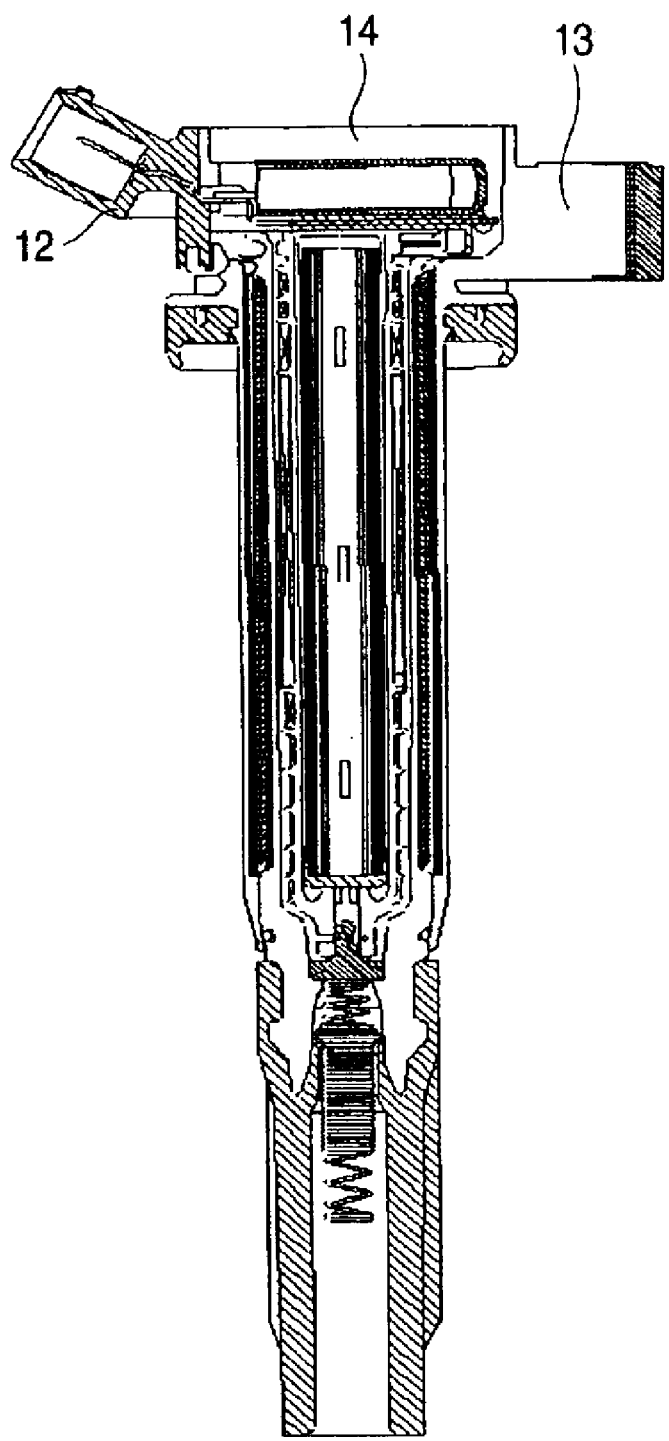
FIG. 6 is a cross-sectional view of the igniter of FIG. 5 mounted on the ignition device.

Referring to FIG. 4, a third embodiment of the invention will be described below. The description of the parts of the main portion as described in the first or second embodiment is omitted. In FIG. 4, the igniter of this invention comprises the internal wiring substrate 5 made of ceramics and formed of alumina, which has the driving control IC. The internal wiring substrate 5 has a circuit pattern printed and the electronic components mounted to provide the additional functions, and is divided into a large current circuit portion and a small current circuit portion, in which the wiring substrate is wired and arranged three-dimensionally in a form in which those circuit portions are placed one on another and electrically connected. The three dimensional arrangement and wiring of the circuit may be made using a lead frame.

The heat sink for heat radiation 4 is disposed within the igniter, and the driving element 6 consisting of a Darlington transistor for making switching drive to shut off or pass the primary current is disposed on its surface.

The igniter has a marginal space because the internal wiring substrate 5 is wired and arranged three dimensionally, when a number of parts are arranged to provide the additional functions, and thereby the space saving of the igniter is enabled.

In the igniter of the third embodiment, the internal wiring substrate 5 is wired and arranged three dimensionally, and divided into the large current portion and the small current portion. Therefore, when the igniter is operated, it is possible to suppress an electromagnetic induction caused due to interference between adjacent patterns. The heat generated from heating parts when the igniter is operated is prevented from being passed, because the internal wiring substrate 5 is wired and arranged three dimensionally. Hence, the igniter is designed with some margin in view of the heat resistance of the parts themselves.

As above described, in the first embodiment of the invention, the connector and the external connection terminal 2 of the igniter are integrated with the outer package of the igniter, and the igniter itself is contained within the igniter case 8. Thereby, the number of parts and the number of assembling steps are reduced, and the assembling steps are simplified to the ignition device for internal combustion engine is supplied cheaply. The stress due to thermal expansion or contraction of the filling epoxy resin 14 is relieved on the igniter, thereby solving the first problem. In the prior art, the bonding points are required by the number of external terminals, with the lower reliability in proportion to the number of bonding points or the number of welding points. However, in this invention, the number of bonding points is reduced in view of enhancing the reliability of the semiconductor assembly, and both the connector and the external connection terminal, which are problematical with the conventional structure, are joined using the terminal with high heat capacity, thereby substantially eliminating the frequent replacement of the welded terminal.

In the second embodiment, the stress due to thermal expansion or contraction of the filling epoxy resin 14 is relieved on the igniter by the rubber based cushioning material 15, thereby solving the second problem.

Further, in the third embodiment, the internal mounting substrate 5 or the lead frame is wired and arranged in three dimensions to make the effective use of the mounting space, whereby the igniter is saved in space. Further, it is possible to suppress an interference due to electromagnetic induction when the igniter is in operation, and design the igniter with the heat resistance, thereby solving the third problem.

What is claimed is:

1. An ignition device for internal combustion engine comprising:
    an igniter case having a primary input terminal;
    an igniter being disposed in said igniter case, said igniter comprising an internal wiring substrate having a large current portion and a small current portion, one of said large current portion and said small current portion being disposed above the other; and
    an ignition coil under said igniter case,
    wherein said igniter disposed in said igniter case and said primary input terminal are connected by wire bonding and are integrally molded.

2. The ignition device for internal combustion engine according to claim 1, wherein a molding resin is filled in said igniter case, and
    mwherein said igniter case comprises plastic capable of absorbing an expansion and contraction stress of said molding resin.

3. The ignition device for internal combustion engine according to claim 1, wherein a molding resin is filled in said igniter case, and
    wherein a rubber based cushioning material is coated on the surface of said molding resin.

4. The ignition device for internal combustion engine according to claim 1, wherein a molding resin is filled in said igniter case,
    wherein after said igniter case is disposed at a predetermined position, a filling epoxy resin is poured into an ignition device case and cured, and
    wherein a rubber based cushioning material is mixed into at least one of said molding resin and said filling epoxy resin.

5. The ignition device according to claim 1, further comprising:
    a connector disposed on said igniter case for connecting to the primary input terminal.

6. The ignition device according to claim 5, wherein said connector and said primary input terminal are integrally formed with said igniter case.

7. The ignition device according to claim 1, wherein said large current portion and said small current portion are wired and arranged three dimensionally having a space disposed between said large current portion and said small current portion.

8. An ignition device for internal combustion engine comprising:
    an igniter case having a primary input terminal
    an igniter being disposed in said igniter case; and
    an ignition coil under said igniter case,
    wherein said igniter comprises:
        a driving element on one of a mounting substrate and a lead frame, in which said one of a mounting substrate and lead frame and said primary input terminal are connected by three dimensional wiring; and an internal wiring substrate having a large current portion and a small current portion, one of said large current portion and said small current portion being disposed above the other.

9. The ignition device according to claim 8, wherein said igniter and said primary input terminal are integrally molded.

10. An igniter module for an internal combustion engine, comprising:

an igniter case having a primary input terminal; and an igniter disposed in said igniter case, said igniter comprising an internal wiring substrate having a large current portion and a small current portion, one of said large current portion and said small current portion disposed above the other, wherein said igniter and said input terminal are connected by wire bonding and are integrally molded.

11. The igniter module according to claim 10, wherein a molding resin is filled in said igniter case, and wherein said igniter case comprises plastic capable of absorbing an expansion and contraction stress of said molding resin.

12. The igniter module according to claim 10, wherein a molding resin is filled in said igniter case, and wherein a rubber based cushioning material is coated on the surface of said molding resin.

13. The ignition device for internal combustion engine according to claim 10, wherein a molding resin is filled in said igniter case, wherein after said igniter case is disposed at a predetermined position, a filling epoxy resin is poured into an ignition device case and cured, and wherein a rubber based cushioning material is mixed into at least one of said molding resin and said filling epoxy resin.

14. The ignition device according to claim 10, comprising:

a connector disposed on said igniter case for connecting to the primary input terminal.

15. The ignition device according to claim 14, wherein said connector and said primary input terminal are integrally formed with said igniter case.

* * * * *